United States Patent [19]

Brodsky et al.

[11] Patent Number: 4,566,913
[45] Date of Patent: Jan. 28, 1986

[54] RAPID THERMAL ANNEALING OF SILICON DIOXIDE FOR REDUCED ELECTRON TRAPPING

[75] Inventors: Marc H. Brodsky, Mt. Kisco; Zeev A. Weinberg, White Plains, both of N.Y.

[73] Assignee: International Business Machines Corporation, Armonk, N.Y.

[21] Appl. No.: 636,042

[22] Filed: Jul. 30, 1984

[51] Int. Cl.$^4$ .................... H01L 21/263; B23K 27/00
[52] U.S. Cl. ........................... 148/1.5; 29/571; 29/576 B; 148/187; 148/188; 148/DIG. 4; 148/DIG. 118
[58] Field of Search ............... 148/1.5, 187, 188; 29/571, 576 B

[56] References Cited

U.S. PATENT DOCUMENTS 3,556,880  1/1971  Heiman ........................... 148/191
4,229,232 10/1980  Kirkpatrick .................... 148/1.5
4,406,053  9/1983  Takasaki et al. ................ 148/1.5
4,482,393 11/1984  Nishiyama et al. ............. 148/1.5

OTHER PUBLICATIONS

Kato et al., Jour. Electrochem. Soc. 131 (May 1984) 1145.
Kadyrakunov et al., Phys. Stat. Sol. 70a (1982) K-15.

Primary Examiner—Upendra Roy
Attorney, Agent, or Firm—Carl C. Kling

[57] ABSTRACT

Silicon dioxide insulating films for integrated circuits are provided with enhanced electronic properties, including decreased water content and reduced trapping of electrons, by exposing a metal oxide semiconductor wafer including an exposed silicon dioxide layer, in an ambient of flowing inert gas, to heating radiation from a halogen lamp for a duration on the order of ten seconds to achieve annealing temperature in the range 600C.-800C.

4 Claims, 2 Drawing Figures

RAPID THERMAL ANNEALING OF SILICON DIOXIDE FOR REDUCED ELECTRON TRAPPING

BACKGROUND OF THE INVENTION

1. Field of the Invention

This invention relates to integrated circuit production, and more particularly to a process for enhancing the electronic properties of silicon dioxide layers in metal oxide semiconductor (MOS) devices, reducing diffused water content and reducing electron trapping by rapid thermal annealing of the integrated circuit wafer during the part of the integrated circuit production process when the silicon dioxide layer is exposed.

2. Description of the Prior Art

The prior art techniques for enhancing the electronic properties of silicon dioxide insulating layers in MOS devices include long anneals at 1000 C to reduce electron trapping.

The prior art techniques do not teach nor suggest the rapid thermal annealing of silicon dioxide insulators in MOS device wafers, but rather require very long anneals, which do not provide the desired enhancement of electronic properties.

SUMMARY OF THE INVENTION

Therefore, it is an object of the present invention to enhance electronic properties of silicon dioxide, particularly by removal of water from the oxide to reduce electron trapping, by a rapid thermal annealing (RTA) process.

A feature of the invention is rapid heating of a semiconductor chip or wafer by controlled application of radiation from a high intensity halogen lamp, so as to carry out an annealing process without disruption of other processes or long waiting periods.

The advantage of the invention is its high quality and convenience; its production of the desired enhancements are achieved without the extra effort and additional chance of contamination or unwanted diffusion inherent in longer anneals.

The foregoing and other objects, features and advantages of the invention will be apparent from the more particular description of the preferred embodiments of the invention, as illustrated in the accompanying drawing.

DESCRIPTION OF A PREFERRED EMBODIMENT OF THE INVENTION

Figure 1:
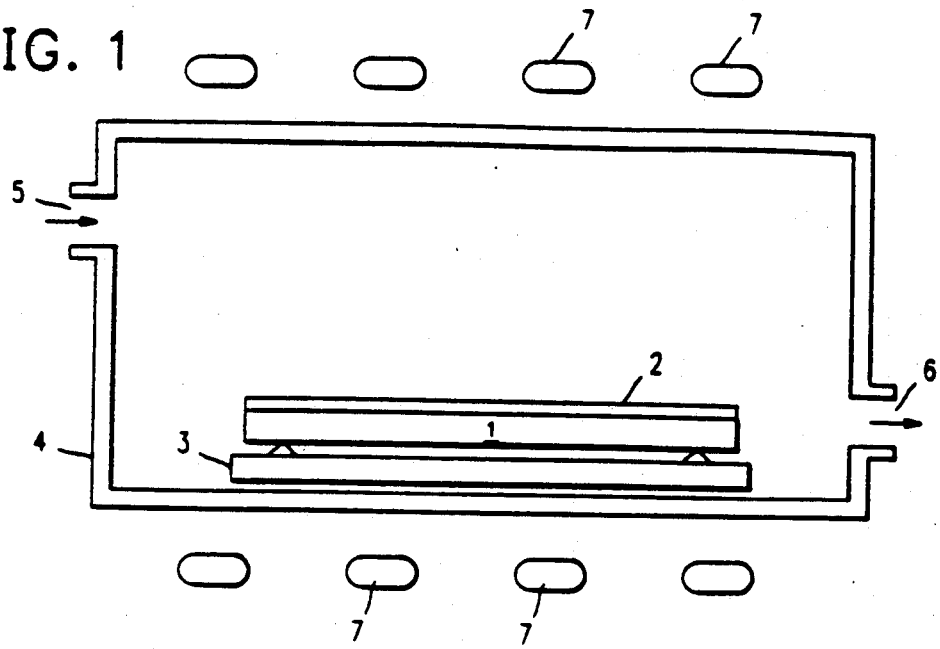
FIG. 1 is a schematic diagram of appropriate apparatus.

The invention is a process for providing reduced electron trapping characteristics to a silicon dioxide insulator film on a MOS integrated circuit wafer. FIG. 1 shows typical apparatus. The silicon semiconductor wafer 1 has silicon dioxide insulator 2 on its surface, which surface will subsequently have conductors deposited upon it. The wafer is supported on a quartz plate 3 and inserted into a quartz enclosure 4. The desired gas is flown into this enclosure at inlet port 5; the gas escapes at exit port 6. An array of lamps 7, which are typically tungsten halogen lamps, are turned on to heat wafer 1 rapidly to the desired annealing temperature for a short time.

The anneal of a silicon dioxide film of thickness on the order of 100–1000 Angstroms is carried out in an atmosphere of argon or nitrogen at atmospheric pressure. The preferred anneal is ten seconds at 600 C.

Anneals as low as 500 C for ten seconds convert oxides with diffused water into oxides as good as those grown in ultra-dry processes. The effective range of temperatures and durations is 300 C–800 C for 3–15 seconds.

Figure 2:
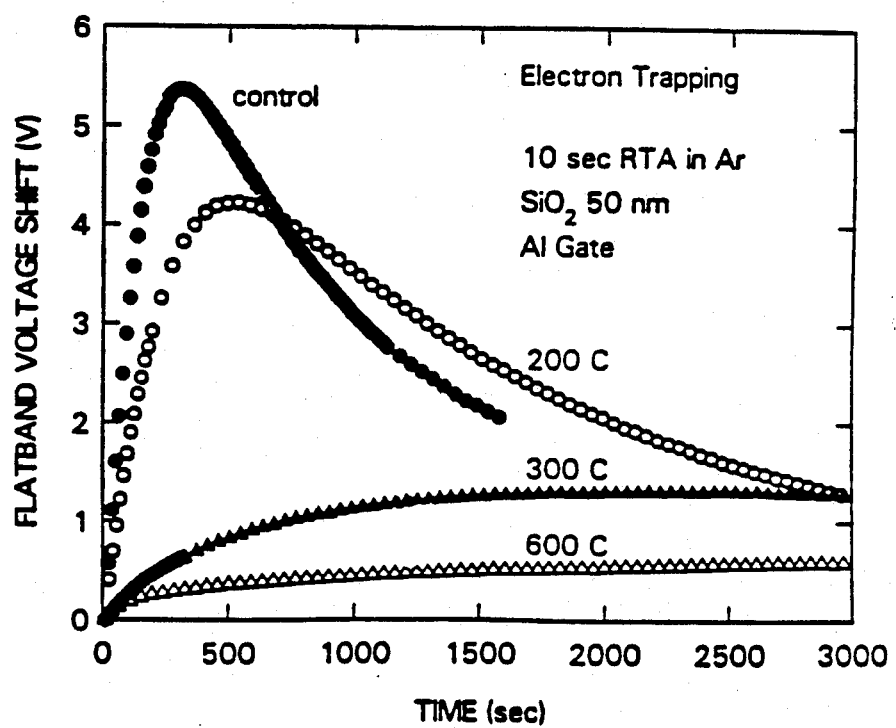
FIG. 2 is a graph showing electron trapping.

FIG. 2 shows the reduction in electron trapping achieved by the rapid thermal annealing; it is a graph of flatband voltage shifts as a function of electron injection time in MOS capacitor structures. The flatband voltage shifts are proportional to the amount of electron trapping in the silicon dioxide. The control curve shows high trapping in oxides before annealing. The control had water diffused into the silicon dioxide film to increase the electron trapping effect for the purpose of the experiment. Other curves, labeled with annealing temperatures for rapid thermal annealing (RTA) show improvement in the form of reduced electron trapping. In particular, the curve for 600 C shows drastically reduced electron trapping, approaching the 0 trapping level.

Thus, while the invention has been described with reference to a preferred embodiment, those skilled in the art that various fast wafer or chip heating techniques may be used, and that changes in form and detail may be made without departing from the scope of the invention.

What is claimed is:

1. A process for enhancing electronic properties of a thin silicon dioxide insulating layer on an integrated circuit wafer characterized by
    (a) positioning the wafer inside an enclosure;
    (b) charging said enclosure with a flowing inert gas; and
    (c) quickly heating the wafer by radiation heating to a temperature range 300 C–800 C for a duration 3–15 seconds.

2. A process for enhancing electronic properties of a thin silicon dioxide insulating layer on an integrated circuit wafer characterized by
    (a) positioning the wafer inside an enclosure;
    (b) charging said enclosure with flowing inert gas; and
    (c) quickly heating the wafer by radiation heating to a temperature of 600 C for a duration 10 seconds.

3. A process for enhancing electronic properties in a thin silicon dioxide insulating layer on an integrated circuit wafer according to claim 2 further characterized in that
    said flowing inert gas is nitrogen.

4. A process for enhancing electronic properties in a thin silicon dioxide insulating layer on an integrated circuit wafer according to claim 2 further characterized in that
    said flowing inert gas is argon.